US006370623B1

(12) United States Patent
Mehra et al.

(10) Patent No.: US 6,370,623 B1
(45) Date of Patent: *Apr. 9, 2002

(54) MULTIPORT REGISTER FILE TO ACCOMMODATE DATA OF DIFFERING LENGTHS

(75) Inventors: Vijay K. Mehra, Freemont; Gerrit Ary Slavenburg, Los Altos, both of CA (US)

(73) Assignee: Philips Electronics North America Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/366,958

(22) Filed: Dec. 30, 1994

Related U.S. Application Data

(63) Continuation-in-part of application No. 07/998,080, filed on Dec. 29, 1992, now abandoned, which is a continuation-in-part of application No. 07/654,847, filed on Feb. 11, 1991, now Pat. No. 5,313,551, and a continuation-in-part of application No. 07/594,534, filed on Oct. 5, 1990, now abandoned, and a continuation-in-part of application No. 07/578,976, filed on Sep. 5, 1990, now abandoned, said application No. 07/654,847, filed on Feb. 11, 1991, now abandoned, is a continuation-in-part of application No. 07/290,979, filed on Dec. 28, 1988, now abandoned, said application No. 07/594,534, filed on Oct. 5, 1990, now abandoned, is a continuation-in-part of application No. 07/290,979, filed on Dec. 28, 1988, now abandoned, said application No. 07/578,976, filed on Sep. 5, 1990, now abandoned, is a continuation-in-part of application No. 07/290,979, filed on Dec. 28, 1988, now abandoned.

(51) Int. Cl.$^7$ .............................................. G06F 12/04
(52) U.S. Cl. .................. 711/149; 711/109; 710/130; 710/52
(58) Field of Search .................................. 395/800, 404, 395/310, 872, 307; 711/109, 131, 144, 145, 149, 150, 156, 201, 212; 710/130, 52

(56) References Cited

U.S. PATENT DOCUMENTS

| 4,491,937 A | * | 1/1985 | Chan ........................... 365/154 |
| 4,811,296 A | * | 3/1989 | Garde .................... 365/189.02 |
| 5,168,573 A | | 12/1992 | Fossum et al. |

(List continued on next page.)

FOREIGN PATENT DOCUMENTS

| EP | 0425410 | 5/1991 |
| EP | 0479390 | 4/1992 |
| EP | 0483861 | 5/1992 |

OTHER PUBLICATIONS

Hennessey et al, "MPS: A VLSI Processor Architecture" VLSI Systems and Computations, Springer Verlag 1981, pp 337–346.

Jackson, C., "Multi–port registers enhance processor performance", Electron. Conventions Manage., Los Angeles, CA, 1986, pp. 19/0/106 (abstract only).

Gruger, J., "VHSIC vector arithmetic logic unit (ALU) as an image processing element", Proc. SPIE Int. Soc. Opt. Eng., USA, Very high Speed Integrated Circuit (VHSIC) Tech. for Electro–Optic Appl., Los Angeles, CA, 1/82, vol. 319, pp. 89–97 (abstract only).

(List continued on next page.)

Primary Examiner—B. James Peikari
(74) Attorney, Agent, or Firm—Anne E. Barschall; Debra Stephens

(57) ABSTRACT

A multiport register file includes a first file unit having registers of a first width and a second file unite having registers of a second width. The second width being less than the first width. The first file unit accommodates data destined to be operands for functional units of a VLIW processor, or result data from those functional units. The second file unit accommodates guard bits for conditioning operation of those functional units.

19 Claims, 5 Drawing Sheets

U.S. PATENT DOCUMENTS

| | | | |
|---|---|---|---|
| 5,212,777 A | * | 5/1993 | Gove et al. .................. 712/229 |
| 5,301,340 A | | 4/1994 | Cook |
| 5,313,551 A | * | 5/1994 | Labrousse et al. ........... 711/149 |
| 5,438,674 A | * | 8/1995 | Keele et al. .................... 711/4 |
| 5,450,556 A | * | 9/1995 | Slavenburg et al. ......... 711/149 |
| 5,455,926 A | * | 10/1995 | Keele et al. .................... 711/4 |
| 5,517,628 A | | 5/1996 | Morrison et al. |
| 5,535,288 A | * | 7/1996 | Chen et al. .................. 382/236 |
| 5,627,544 A | * | 5/1997 | Snodgrass et al. ............. 342/42 |
| 5,631,859 A | * | 5/1997 | Markstein et al. ........... 708/513 |
| 5,649,029 A | * | 7/1997 | Galbi .......................... 382/233 |
| 5,651,125 A | * | 7/1997 | Witt et al. ................... 712/218 |
| 5,655,097 A | * | 8/1997 | Witt et al. ................... 712/204 |

OTHER PUBLICATIONS

Wong, D.G., "A proposal for an asynchronous multi-processor computer structure for high-speed digital simulation of continuous systems", Ins. Eng. Aust. Electr. Eng. Trans., Australia, vol. EE–13, No. 2, pp. 88–94, 1977 (abstract only).

"Multiport Register File simplifies and Speeds Digital Processing" by Joel H. Dedrick, Electronic design, May 17, 1984, pp. 213–222.

"Optimizing Allocation of Multi–port Register File for Parallelism in RISC and Its implementation", Li Ya–min et al., Microprocessing and Microprogramming 26 (1989) pp. 113–117.

"Multiport Register File Streamlines Signal Processing" by Joel H. Dedrick, EDN, Nov. 15, 1984, pp. 301–306.

"Multiport Registers Enhance Processor Performance", by Charles Jackson, Consultant, CyberCraft, Inc. Louisville, CO 80027, pp. 1–6.

"Multiport Register File Architecture", Kerry Berstein et al., IBM Corporation. Essex Jct., VT, pp. 48–49.

"A VLIW Architecture for a Trace Scheduling Compiler", Robert P. Colwell, et al., IEEE Transactions on a Computers, vol. 37, No. 8, Aug. 1988, pp. 967–979 (see esp. p. 969).

* cited by examiner

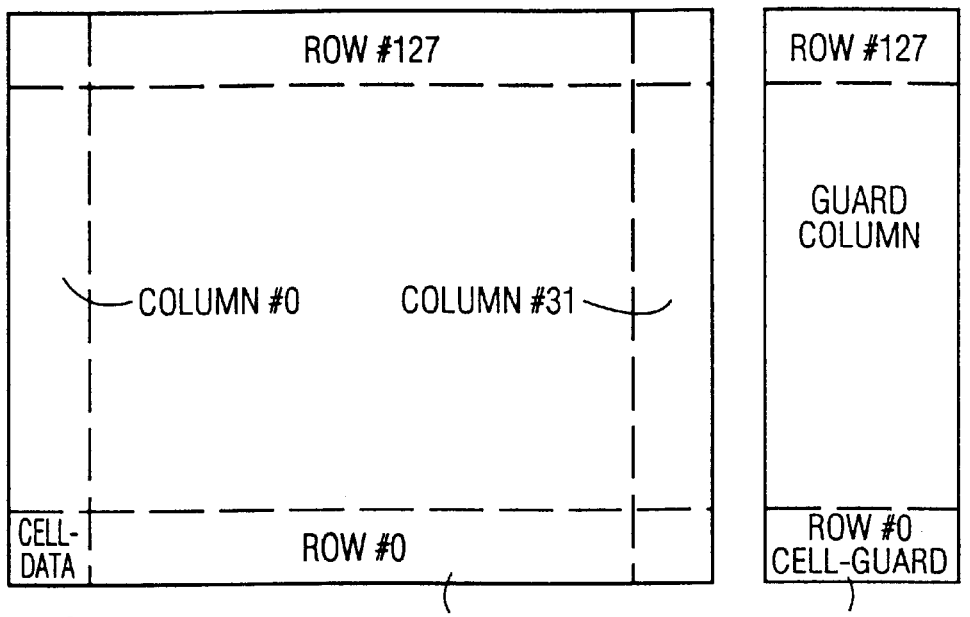
FIG. 5  (a) DATA REGISTER FILE   (b) GUARD REGISTER FILE
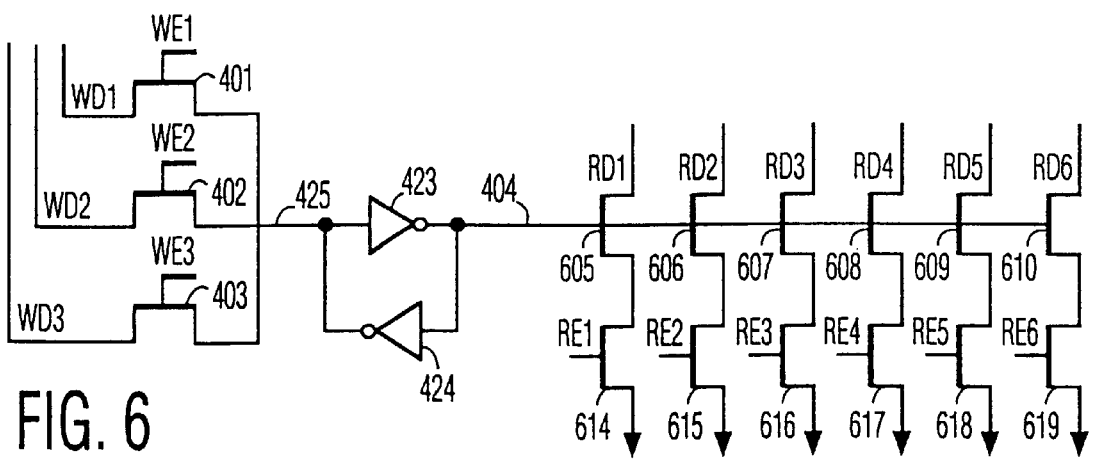
FIG. 6
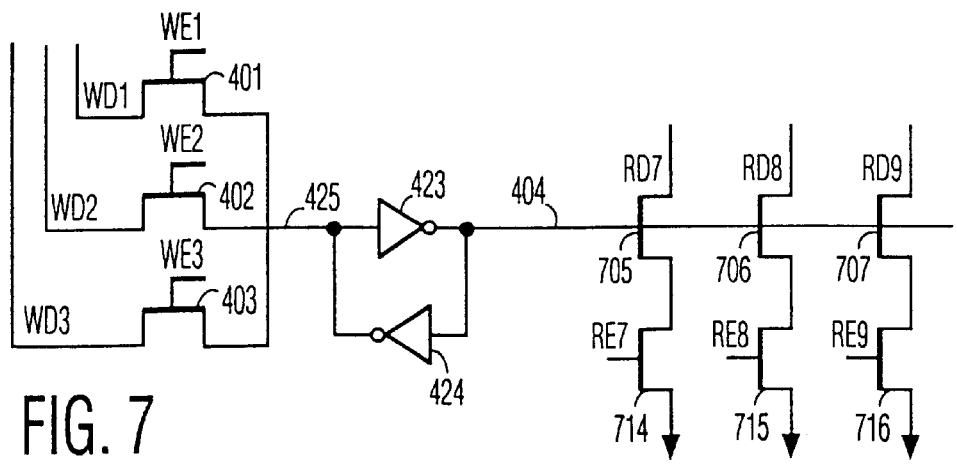
FIG. 7

MULTIPORT REGISTER FILE TO ACCOMMODATE DATA OF DIFFERING LENGTHS

RELATED APPLICATIONS

The present application is a continuation-in-part of U.S. application Ser. No. 998,080 filed Dec. 29, 1992, now abandoned, which in turn is a continuation-in-part of U.S. application Ser. No. 578,976 (PHA 1205) filed Sep. 5, 1990, which was abandoned and refiled as U.S. application Ser. No. 142,648 on Oct. 25, 1993, now U.S. Pat. No. 5,450,556;

U.S. application Ser. No. 594,534 (PHA 1209) filed on Oct. 5, 1990, which was abandoned and refiled as U.S. application Ser. No. 063,850 on May 15, 1993; and U.S. application Ser. No. 654,847 (PHA 1211) filed Feb. 11, 1991, which has since issued as U.S. Pat. No. 5,313,551;

all of which were continuations-in-part of U.S. application Ser. No. 290,979 (PHN 12,376) filed Dec. 28, 1988, which was abandoned and refiled as U.S. application Ser. No. 593,336 on Oct. 1, 1990, which has since issued as U.S. Pat. No. 5,103,311.

All of the parent applications are incorporated herein by reference.

BACKGROUND OF THE INVENTION

1. Field of the Invention

The invention relates to the field of multiport register files for use in digital data processors.

2. Related Art

Multiport register files are used for digital data processors which need to access plural registers simultaneously. In particular, such register files are useful for VLIW (Very Long Instruction Word) processors. Such processors also include an instruction register accommodating plural operation codes and a plurality of functional units for executing the plural operations codes, starting simultaneously in a single machine cycle.

Multiport register files can be used in other types of processors as well.

A prior art multiport register file is shown in FIG. 1. This file includes 128 32 bit registers.

To the left of the file are shown write address ports, WA1, WA2, and WA3, each being eight bits wide. Also shown on the left are write ports WD1, WD2, WD3, each being 32 bits wide. Results from 3 functional units can be written simultaneously on the write ports at the addresses specified on the write address ports.

To the right of the file are shown read address ports RA1, RA2, RA3, RA4, RA5, RA6, RA7, RA8, and RA9, each being eight bits wide. Also shown on the right are read ports, RD1, RD2, RD3, RD4, RD5, RD6, RD7, RD8, and RD9, each being 32 bits wide. Up to nine operands destined for the functional units can be read from this file simultaneously on the read ports from the addresses specified on the read address ports.

In VLIW processors, guard bits are used to condition writing of results from the functional units to the multiport register file. Guard bits become necessary in VLIW processors because of branching delays, as explained in U.S. application Ser. No. 594,534 filed Oct. 5, 1990. The functional units execute operations during a branch delay before the processor resolves whether results of those operations will actually be used. After the operations are completed, each functional unit will write results to the register file only if an associated guard bit has an appropriate value.

There are nine read ports in this particular file unit, because the VLIW processor in question has an instruction word accommodating 3 operations. Each operation will typically require two data operands and a guard bit. There are three write ports to accommodate a result from each of 3 simultaneously executing functional units. Each read or write port has an associated address port.

Ordinarily, the guard bits are to be supplied from the multiport register file. Guard bits, or multibit guard values, are generally much smaller than the thirty-two bit registers and thirty-two bit read and write ports available in the prior art register file. Where the writing from each functional unit is to be conditioned by a guard bit or value, a great deal of unnecessary circuitry is necessary, in particular extra 32-bit write and read port and extra 8-bit write and read address ports.

SUMMARY OF THE INVENTION

The object of the invention is to reduce circuitry necessary for operation of the multiport register file.

This object is achieved by dividing the multiport register file into two file units. The first file unit has wider registers than the second file unit.

Guard bits will be stored in the second file unit for VLIW processors. For other types of processors, other types of short data can be stored in the second file unit. Such short data can include flags, for example.

BRIEF DESCRIPTION OF THE DRAWING

The invention will now be explained by way of non-limitative example with reference to the following figures:

FIG. 5 shows a floor plan of register files in accordance with the invention.

FIG. 6 shows a register file cell suited for use in the data portion of the register files of FIG. 5.

FIG. 7 shows a register file cell suited for use in the guard portion of the register files of FIG. 5.

DETAILED DESCRIPTION OF THE PREFERRED EMBODIMENT

Figure 2:
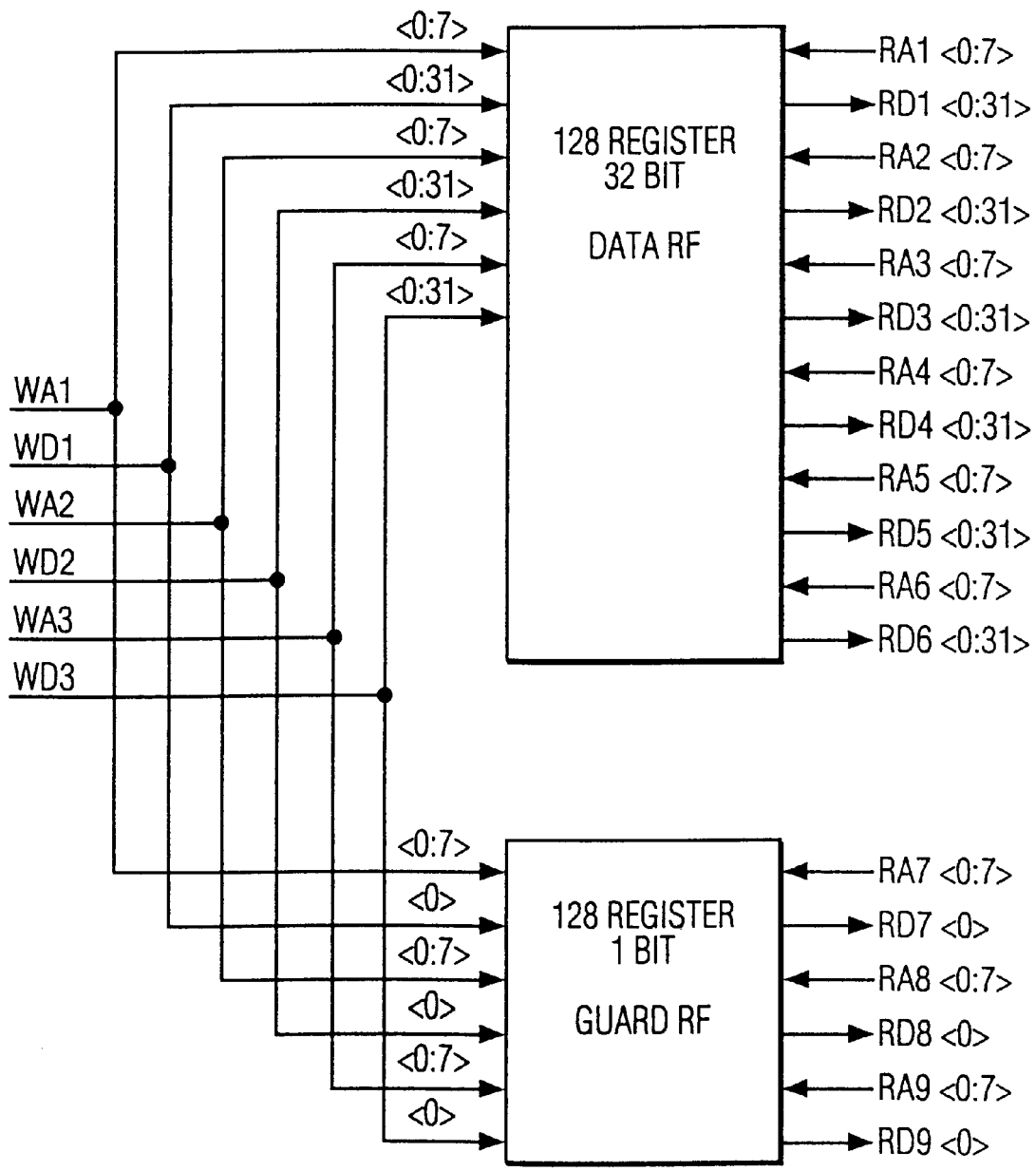
FIG. 2 shows a multi-port register file according to the invention.

FIG. 2 shows a multi-port register file according to the invention. The file is divided into two pieces, a data file unit, which is again a 128 register, 32-bit wide, file, and a guard file unit, which is 128 register, 1-bit wide file.

The write address inputs WA1, WA2, WA3 and write data inputs WD1, WD2, and WD3 are as indicated in the prior art. However, only one bit of the data inputs need be routed to the guard file. No routing circuits are necessary because the guard bits are written to both files and only read from one. The read address inputs RA1, RA2, RA3, RA4, RA5, and RA6 and the read data outputs RD1, RD2, RD3, RD4, RD5, and RD6 are dedicated to the data file. The read address inputs RA7, RA8, and RA9 and the read data outputs RD7, RD8, and RD9 are dedicated to the guard file. Since the read data outputs dedicated to the guard file are only one bit wide, substantial circuitry is saved over the prior art implementation in which 3 extra 32-bit wide data buses are necessary at the output of the data file. The read ports and write ports fit into the architecture of parent application Ser. No. 998,080 filed Dec. 29, 1992 just as the prior art multiport register file did.

Figure 1:
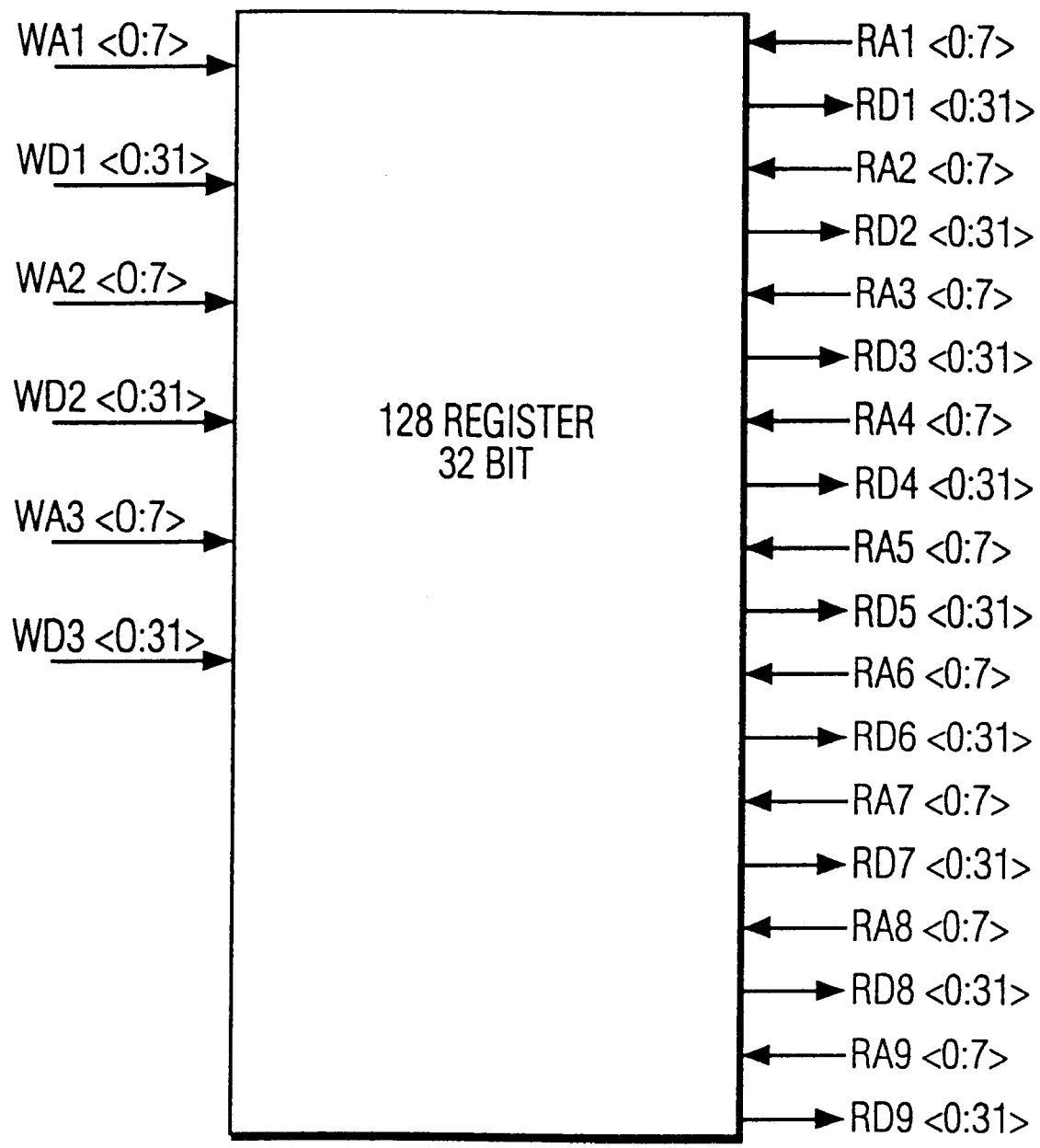
FIG. 1 shows a prior art multi-port register file.
Figure 3:
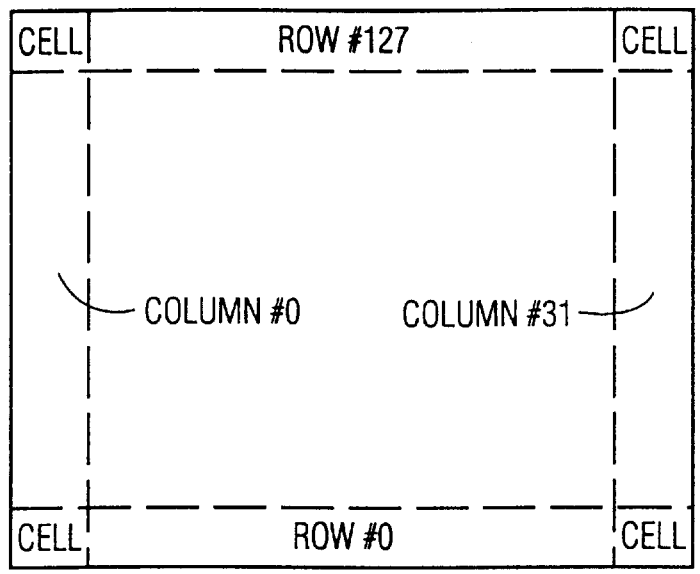
FIG. 3 shows a floor plan of a register file.

FIG. 3 shows a floor plan of a register file in accordance with FIG. 1. The file consists of a matrix of register cells, arranged in rows and columns. For brevity only the top and bottom rows and left and right columns are shown. There are thirty-two columns, one for each bit of the registers. There are 128 rows, one for each of the registers.

Figure 4:
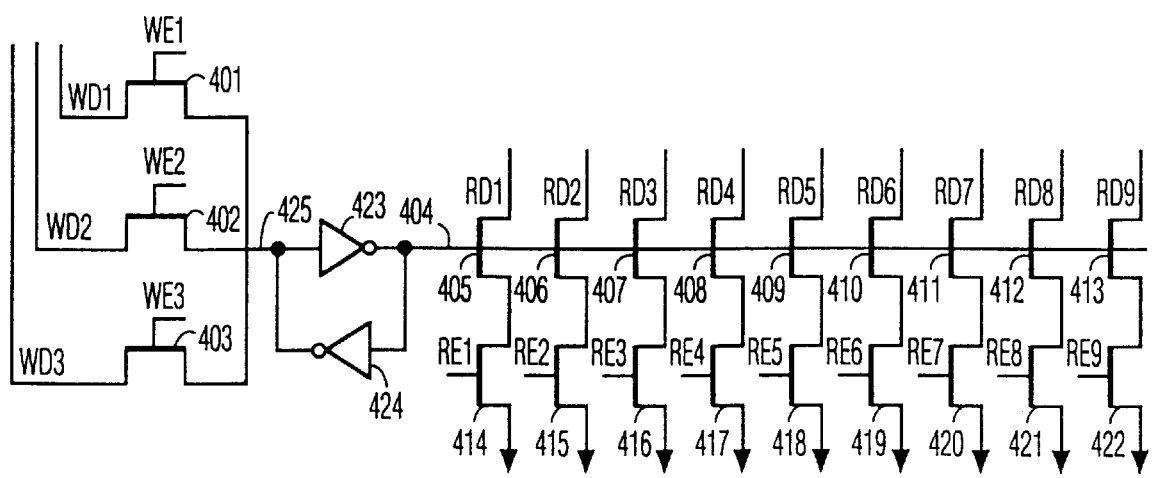
FIG. 4 shows a register cell which would be suited to use in the prior art floor plan.

FIG. 4 shows a register cell suitable for use in the floor plan of FIG. 3. At the left are input respective bits of the write data signals WD1, WD2, and WD3, which bits are connected to MOSFETs 401, 402, and 403, respectively. The gates of MOSFETs 401, 402, and 403 are coupled with respective bits of the write enable signals WE1, WE2, and WE3. Junction 425 functions as a wired OR inputing to inverter 423. A feedback inverter 424 is coupled between the input and output of inverter 423. The output 404 of inverter 423 is coupled to the gates of MOSFETs 405–413. MOSFETs 405–413 are connected to respective bits of RD1–RD9. MOSFETs 405–413 are also connected to MOSFETS 414–422, respectively. The gates of MOSFETs 414–422 are connected to respective bits of the read enable signals RE1–RE9, respectively.

Thus in the register file of FIG. 3, one could expect the following:

| Location and type of component | Number of components |
| --- | --- |
| write data wires per cell | 3 |
| read data wires per cell | 9 |
| write enable wires per cell | 3 |
| read enable wires per cell | 9 |
| horizontal wires (i.e. read enable and write enable) per row | 12 |
| vertical wires (i.e. read data and write data) per column | 12 |
| number of transistors per cell | 25 |
| total horizontal wires in register file core | 12*128 = 1536 |
| total vertical wires in register file core | 12*32 = 384 |
| total transistors in register file core | 25*32*128 = 102400 |

FIG. 5 shows the floor plan of the multiport register file in accordance with the invention. The new multiport register file includes a data register file unit (a) having the same floor plan as the prior art and a guard register file unit (b) having one column of 128 register cells. Although the floor plan of the data register file unit (a) is the same as for the prior art register file, the register cells needed for the new data register file are vastly simplified. The cells needed for the guard register file unit (b) are simpler still.

FIG. 6 shows a register cell which would function in the data register file unit (a) according to the invention. The left portion of the register cell is the same as that in FIG. 4, with like components having like reference numerals. However the right portion of the cell is simplified with transistors 605–610 being substituted for 405–413 and transistors 614–619 being substituted for transistors 414–422. In other words the cell of FIG. 6 has 6 less transistors and correspondingly less read lines than the cell of FIG. 4.

FIG. 7 shows a register cell which would function in the guard register unit (b) of FIG. 5. The left portion of this cell resembles the left portion of the cell of FIG. 4. However, the right portion is even more simplified than the cell of FIG. 6. MOSFETs 705–707 are substituted for MOSFETs 405–413 and MOSFETs 714–716 are substituted for MOSFETs 414–412. MOSFETs 705–707 are connected to respective bits of read data lines RD7–RD9. MOSFETs 714–716 are coupled with respective bits of read enable lines RE7–RE9. In other words the cells of FIG. 7 have 12 less transistors than the cells of FIG. 4 and 6 less transistors than the cells of FIG. 6, with correspondingly fewer read lines. Since the read enable lines RE7–9 are not needed in the data register file unit (a) and the read enable lines RE1–6 lines are not needed in the guard register file unit (b), the lines RE7–9 can occupy the same horizontal spaces as allocated to three of the lines RE1–6. Accordingly, no additional horizontal wire space is needed for RE7–9.

Thus in the register file of FIG. 5, one finds the following:

| Type and location of component | Number of components |
| --- | --- |
| Write data wires per data cell | 3 |
| Read data wires per data cell | 6 |
| Write enable wires per data cell | 3 |
| Read enable wires per data cell | 6 |
| Horizontal wires (i.e. read and write enable) per data row | 9 |
| Vertical wires (i.e. read and write data) per data column | 9 |
| Transistors per data cell | 19 |
| Write data wires per guard cell | 3 |
| Read data wires per guard cell | 3 |
| Write enable wires per guard cell | 3 |
| Read enable wires per guard cell | 3 |
| Horizontal wires (read enable and write enable) per guard row | 6 |
| Vertical wires (read data and write data) per guard column | 6 |
| Transistors per guard cell | 13 |
| Total horizontal wire spaces | 9*128 = 1152 |
| Total vertical wires | 9*32+6*1 = 294 |
| Total transistors | 19*32*128 + 13*1*128 = 79488 |

Thus the embodiment of FIGS. 2 and 5–7 has 22,912 fewer transistors, 384 fewer horizontal wire spaces and 90 fewer vertical wires than the embodiment of FIGS. 1 and 3–4.

Figure 8:
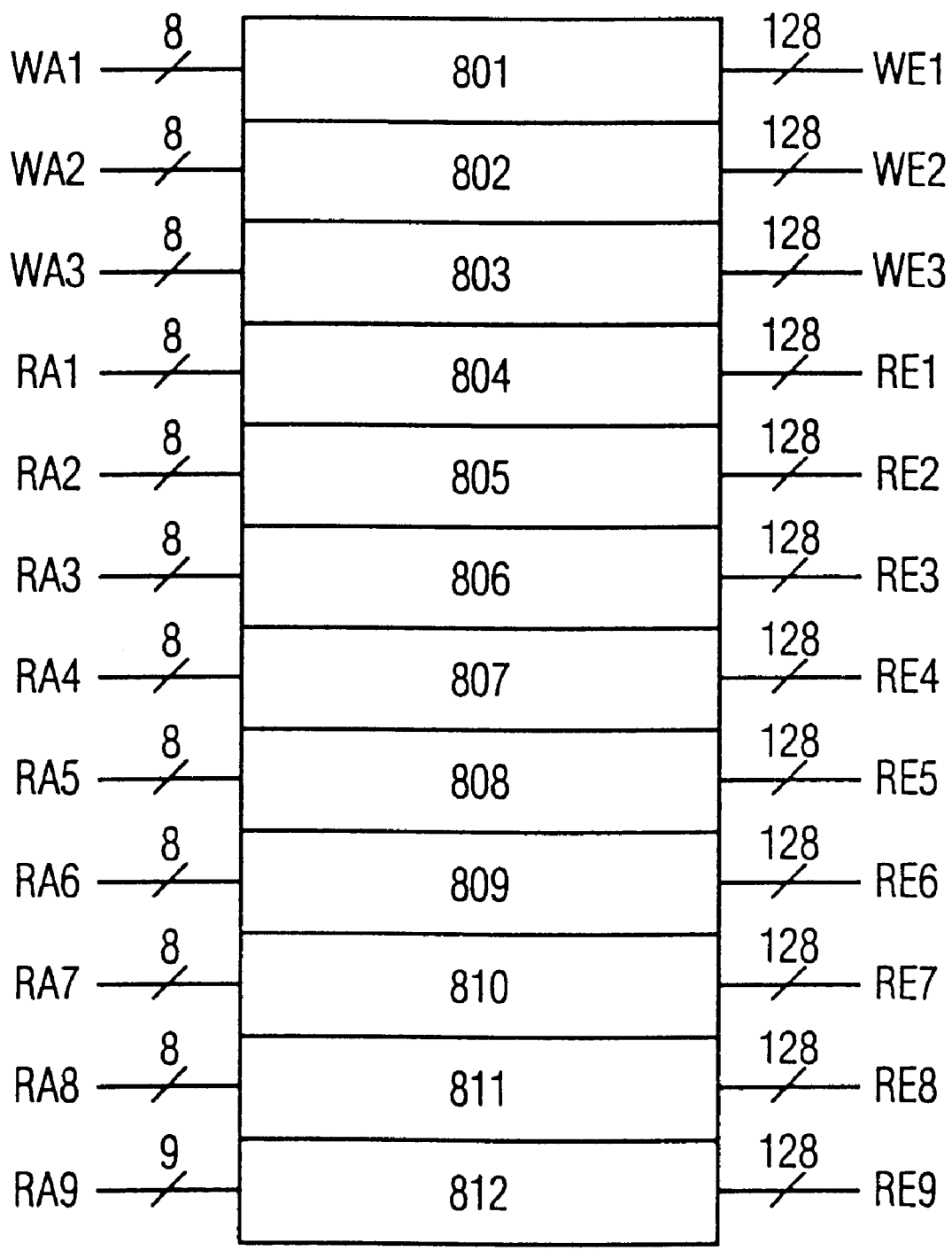
FIG. 8 shows a decoder for converting read and write address signals into read and write enable signals.

The read enable inputs and write enable inputs in FIGS. 4, 6, and 7 are obtained from the read address inputs and the write address inputs using a decoder circuit as shown in FIG. 8. Standard address decoding blocks are shown at 801, 802, 803, 804, 805, 806, 807, 808, 809, 810, 811, 812. These blocks convert the eight bit addresses WA1, WA2, WA3, RA1, RA2, RA3, RA4, RA5, RA6, RA7, RA8, RA9 into 128 bit enable signals WE1, WE2, WE3, RE1, RE2, RE3, RE4, RE5, RE6, RE7, RE8, and RE9, respectively.

Each bit of the write enable signals relates to a respective row of the register file, and goes to each cell in that respective row of both the data register file unit (a) and the guard register file unit (b). Each bit of the read enable signals RE1, RE2, RE3, RE4, RE5, and RE6 relates to a respective row of the data register file unit (a) and goes to each cell in that respective row of the data register file unit (a). Each bit of the read enable signals RE7, RE8, and RE9 relates to a respective row of the guard register file unit (b) and goes to each cell in that respective row of the guard register file unit (b). Thus, for example, bit 1 of WE1 goes to each cell in row 1 of both register file units; bit 1 of RE1 goes to each cell in row 1 of the data register file unit (a); bit 1 of RE7 goes to the cell in row 1 of the guard file register unit (b); and so forth.

Those of ordinary skill in the art will readily recognize that multi-port register files according to the invention can have a variety of other embodiments. These embodiments include the following. The data registers can be any width, such as 16 bits, which is used for operand or result data in a particular processor. The guard registers can be slightly wider if multibit guard or flag values are to be used. More register files may be used if the processor needs to use data of other, different widths.

What is claimed is:

1. A multiport register file comprising:
   a first number of write ports and the first number of write address ports, for writing register data to the file on the write ports at addresses specified on the write address ports;
   a second number of read ports and the second number of read address ports, for reading register data from the file on the read ports from addresses specified on the read address ports;
   a first register file unit, including a third number of first registers, each first register having a fourth number of bits; and
   a second register file unit, including a fifth number of second registers, each second register having a sixth number of bits, which sixth number is smaller than the fourth number,
   wherein at least one of the read ports is connected to only one of the first and second register units.

2. A VLIW processor comprising a multiport register file according to claim 1.

3. The multiport register file of claim 1, wherein the first number is at least one and the second number is at least two.

4. The multiport register file of claim 1, wherein at least one bit of at least one of the write ports is connected to both the first and second register file units.

5. A multiport register file comprising:
   a first number of write ports and the first number of write address ports, for writing register data on the write ports at addresses specified on the write address ports;
   first and second file units each comprising a plurality of registers, the first and second file units each being connected in parallel to the write ports and the write address ports;
   a second number of first read ports and the second number of first read address ports, for reading register data from the first file unit on the first read ports from addresses specified on the first read address ports;
   a third number of second read ports and the third number of second read address ports, for reading register data from the second file unit on the second read ports from addresses specified on the second read address ports.

6. The multiport register file of claim 5, wherein the registers of the first file unit each store a fourth number of bits and the registers of the second file unit each store a sixth number of bits.

7. The multiport register file of claim 6, wherein data of more than the sixth number of bits are written simultaneously to the first and second file units, so that a second version of the data stored in the second unit has only the sixth number of bits, while a version of the data stored in the first file unit has more than the sixth number of bits.

8. The multiport register file of claim 6, wherein the sixth number of lines of the write ports are connected to the second file unit, while the fourth number of lines of the write ports are connected to the first file unit.

9. The multiport register file of claim 6, wherein the first read ports have the fourth number of lines, while the second read ports have the sixth number of lines.

10. A VLIW processor comprising the multiport register file of claim 5.

11. The VLIW processor of claim 10, wherein the first file unit is for storing operands and the second file unit is for storing guard bits.

12. The multiport register file of claim 5, wherein the first, second, and third numbers are each at least one.

13. A multiport register file comprising:
   a first number of write ports and the first number of write address ports, for writing register data to the file on the write ports at addresses specified on the write address ports;
   a second number of read ports and the second number of read address ports, for reading register data from the file on the read ports from addresses specified on the read address ports;
   a third number of first registers, each first register having a fourth number of bits; and
   a fifth number of second registers, each second register having a sixth number of bits, which sixth number is smaller than the fourth number,
   wherein:
      the first registers are disposed within a first file unit;
      the second registers are disposed within a second file unit;
      both the first and second file units are writable by at least one bit of all of the write ports; and
      the read ports are divided between the first and second file units, such that less wiring and components are necessary for implementing the read ports than would be necessary for a register file with a single file unit having uniform length registers and the second number of read ports.

14. The multiport register file of claim 13, wherein the second file unit accommodates guard bits.

15. The multiport register file of claim 14, wherein the guard bits are intended for conditioning writing results of operations from associated functional units of a VLIW processor to the first file unit.

16. The multiport register file of claim 13, wherein the second file accommodates flag bits.

17. The multiport register file of claim 16, wherein the first number is at least one and the second number is at least two.

18. The multiport register file of claim 13, wherein the fourth number is 32 and the sixth number is 1.

19. The multiport register file of claim 13, wherein the first file unit is writeable by all of the bits of all of the write ports and second file unit is writeable by less than all of bits of the write ports.

* * * * *

UNITED STATES PATENT AND TRADEMARK OFFICE
CERTIFICATE OF CORRECTION

PATENT NO. : 6,370,623 B1
DATED : April 9, 2002
INVENTOR(S) : Vijay K. Mehra and Gerrit Ary Slavenburg It is certified that error appears in the above-identified patent and that said Letters Patent is hereby corrected as shown below:

<u>Title page,</u>
Item [73], Assignee: replace "Philips Electronics North America Corporation, New York, NY (US)" with -- Trimedia Technologies, Sunnyvale, CA (US) --.

Signed and Sealed this

Thirty-first Day of December, 2002

JAMES E. ROGAN
*Director of the United States Patent and Trademark Office*